United States Patent
Goto et al.

(10) Patent No.: US 10,134,940 B2
(45) Date of Patent: Nov. 20, 2018

(54) METHOD OF MANUFACTURING SOLAR CELL

(71) Applicant: Sanyo Electric Co., Ltd., Moriguchi, Osaka (JP)

(72) Inventors: Ryo Goto, Kobe (JP); Daisuke Ide, Kobe (JP); Mitsuaki Morigami, Izumiotsu (JP); Youhei Murakami, Minoh (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 563 days.

(21) Appl. No.: 13/751,349

(22) Filed: Jan. 28, 2013

(65) Prior Publication Data

US 2013/0180585 A1 Jul. 18, 2013

Related U.S. Application Data

(63) Continuation of application No. PCT/JP2011/067281, filed on Jul. 28, 2011.

(30) Foreign Application Priority Data

Jul. 30, 2010 (JP) ................................ 2010-171340

(51) Int. Cl.
*H01L 31/18* (2006.01)
*H01L 31/078* (2012.01)
(Continued)

(52) U.S. Cl.
CPC ...... *H01L 31/18* (2013.01); *H01L 31/022441* (2013.01); *H01L 31/0682* (2013.01);
(Continued)

(58) Field of Classification Search
CPC ................... H01L 31/18; H01L 31/078; H01L 31/022441; H01L 31/1804; H01L 31/0747; H01L 31/0682
(Continued)

(56) References Cited

U.S. PATENT DOCUMENTS

2004/0200520 A1 10/2004 Mulligan et al.
2008/0061293 A1* 3/2008 Ribeyron .......... H01L 31/02243
257/53
(Continued)

FOREIGN PATENT DOCUMENTS

DE 102008030880 A1 6/2009
DE 102008013446 A1 8/2009
(Continued)

OTHER PUBLICATIONS

"Definition of Thickness in English:." Thickness: Definition of Thickness in Oxford Dictionary (American English) (US). Oxford English Dictionaries, n.d. Web. May 27, 2015.*
(Continued)

*Primary Examiner* — Magali P Slawski
*Assistant Examiner* — Kourtney R S Carlson
(74) *Attorney, Agent, or Firm* — Metrolexis Law Group, PLLC (57) ABSTRACT

A method of manufacturing a solar cell includes: forming a solar cell substrate having one main surface and the other main surface and having a p-type surface and an n-type surface which are exposed on one region and another region in the one main surface, respectively; forming seed layers in an electrically separated state on the p-type surface and the n-type surface, respectively; and forming a plated film on the seed layer on each of the p-type surface and the n-type surface by an electrolytic plating method.

7 Claims, 7 Drawing Sheets

(51) Int. Cl.
*H01L 31/0224* (2006.01)
*H01L 31/0747* (2012.01)
*H01L 31/068* (2012.01)

(52) U.S. Cl.
CPC ........ *H01L 31/078* (2013.01); *H01L 31/0747* (2013.01); *H01L 31/1804* (2013.01); *Y02E 10/547* (2013.01); *Y02P 70/521* (2015.11)

(58) Field of Classification Search
USPC .................................. 136/252–265; 438/57
See application file for complete search history.

(56) References Cited

U.S. PATENT DOCUMENTS

| | | | | |
|---|---|---|---|---|
| 2008/0128013 | A1* | 6/2008 | Lopatin | C25D 5/022 136/244 |
| 2009/0311825 | A1 | 12/2009 | Krause et al. | |
| 2010/0029039 | A1* | 2/2010 | Shan | H01L 31/02242 438/98 |
| 2010/0139764 | A1* | 6/2010 | Smith | H01L 31/182 136/256 |
| 2010/0218800 | A1* | 9/2010 | Cousins | 136/244 |
| 2011/0000532 | A1* | 1/2011 | Niira | H01L 31/0747 136/255 |
| 2011/0023956 | A1* | 2/2011 | Harder | 136/256 |
| 2011/0041902 | A1* | 2/2011 | Krokoszinski | H01L 31/02244 136/255 |
| 2011/0303280 | A1* | 12/2011 | Pawlak et al. | 136/256 |
| 2014/0209166 | A1 | 7/2014 | Krokoszinski et al. | |

FOREIGN PATENT DOCUMENTS

| | | |
|---|---|---|
| JP | 2005-260157 A | 9/2005 |
| JP | 2009-200267 A | 9/2009 |
| JP | 2009-540584 A | 11/2009 |
| JP | 2010-123859 A | 6/2010 |
| JP | 2010-147324 A | 7/2010 |
| WO | wo09101107 A1 * | 8/2009 |

OTHER PUBLICATIONS

A European office action dated Mar. 6, 2017 for the counterpart European Application No. 11812572.3.

* cited by examiner

METHOD OF MANUFACTURING SOLAR CELL

CROSS REFERENCE TO RELATED APPLICATIONS

This application is a continuation application of International Application No. PCT/JP2011/067281, filed on Jul. 28, 2011, entitled "METHOD OF MANUFACTURING SOLAR CELL AND SOLAR CELL", which claims priority based on Article 8 of Patent Cooperation Treaty from prior Japanese Patent Applications No. 2010-171340, filed on Jul. 30, 2010, the entire contents of which are incorporated herein by reference.

BACKGROUND OF THE INVENTION

1. Field of the Invention

This disclosure relates to a method of manufacturing a back junction solar cell, and a solar cell.

2. Description of Related Art

In recent years, solar cells have been drawing keen attention as an energy source with a low impact on the environment. Thus, there have been active research and development in solar cells. Above all, the key issue is how to improve power generation efficiency of the solar cell. Thus, the research and development have been particularly active in a solar cell having improved power generation efficiency and in a method of manufacturing the same.

As a solar cell having high power generation efficiency, the following Patent Document 1 and the like, for example, proposes so-called a back junction solar cell having a p-type region and an n-type region formed on a back side of the solar cell. In this back junction solar cell, no electrode needs to be provided on a light-receiving side. Thus, the back junction solar cell can improve light reception efficiency. Therefore, more improved power generation efficiency can be achieved. Moreover, connection of solar cells by wiring can be performed only on the back side. Thus, wide wiring materials can be used. Therefore, a voltage drop due to connection of multiple solar cells by wiring can be prevented.

Patent Document 1: Japanese Patent Application Publication No. 2009-200267

SUMMARY OF THE INVENTION

However, it is hard to say that ample studies have been done until now on an electrode structure or a method for forming electrodes to improve the power generation efficiency of the solar cell. Therefore, a significant challenge is to further improve the power generation efficiency of the solar cell by obtaining a more favorable electrode structure and method for forming electrodes.

The invention is made in consideration of the foregoing problem. It is an objective of an embodiment of the invention to provide a method of manufacturing a solar cell having improved power generation efficiency and a solar cell having improved power generation efficiency.

In a method of manufacturing a solar cell according to an aspect of the invention, a solar cell substrate is formed which has one main surface and the other main surface and has a p-type surface and an n-type surface that are exposed on one region and another region in the one main surface, respectively. Seed layers in an electrically separated state are formed on the p-type surface and the n-type surface, respectively. A plated film is formed on the seed layer on each of the p-type surface and the n-type surface by an electrolytic plating method.

A solar cell according to another aspect of the invention includes a solar cell substrate and an electrode layer. The solar cell substrate has one main surface and the other main surface and has a p-type surface and an n-type surface which are exposed on one region and another region in the one main surface, respectively. The electrode layer is formed on each of the p-type surface and the n-type surface. An electrode formed on one of the p-type surface and the n-type surface, which has a larger area, is larger in thickness than an electrode formed on the other surface.

The aspect(s) of invention can provide a method of manufacturing a solar cell having improved power generation efficiency and a solar cell having improved power generation efficiency.

DETAILED DESCRIPTION OF EMBODIMENTS

Examples of preferred embodiments of the invention are described below. However, the following embodiments are provided as examples but are not intended to limit the invention thereto.

Note that, in the drawings to be referred to in the embodiments and the like, members having substantially the same functions are denoted by the same reference numerals. In addition, the drawings to be referred to in the embodiments and the like are schematic and ratios of dimensions and the like are different from actual ones. Moreover, the drawings also include portions having different dimensional relationships and ratios from each other. Therefore, specific dimensions and the like should be determined in consideration of the following description.

First Embodiment (Configuration of Solar Cell 1)

Figure 1:
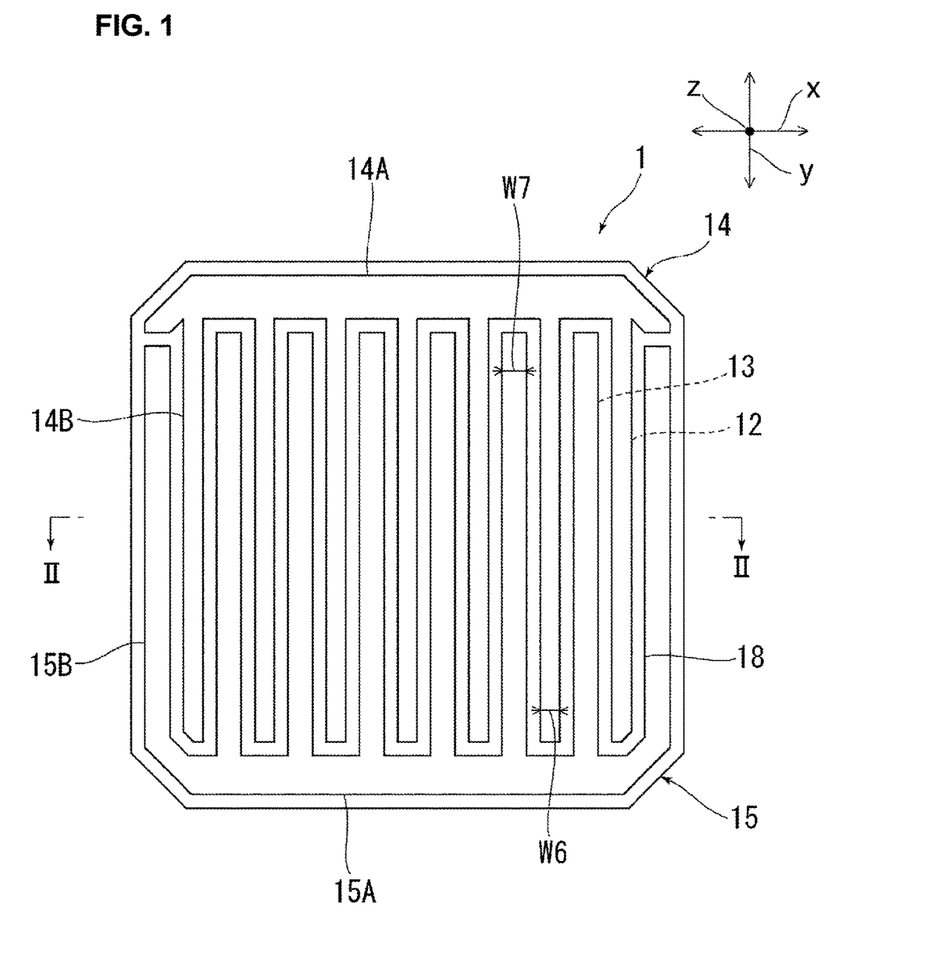
FIG. 1 is a schematic plan view of a solar cell according to a first embodiment.

First, a configuration of solar cell 1 to be produced in this embodiment is described in detail with reference to FIGS. 1 and 2.

Solar cell 1 is a back junction solar cell. Note that when solar cell 1 of this embodiment cannot achieve a sufficiently large output by itself, multiple solar cells 1 may be connected by wiring and used as a solar cell module.

Solar cell 1 includes semiconductor substrate 10. Semiconductor substrate 10 has light-receiving surface 10a as a second main surface and back surface 10b as a first main surface. Semiconductor substrate 10 receives light 11 on light-receiving surface 10a to generate carriers. Here, the carriers are holes and electrons to be generated by semiconductor substrate 10 absorbing light.

Semiconductor substrate 10 is formed using a crystalline semiconductor substrate having an n-type or p-type conductivity. Specific examples of the crystalline semiconductor substrate include crystalline silicon substrates such as a single-crystal silicon substrate and a polycrystalline silicon substrate, for example.

Note that the semiconductor substrate can also be formed using semiconductor substrates other than the crystalline semiconductor substrate. For example, a compound semiconductor substrate made of GaAs, InP or the like can be used in place of semiconductor substrate 10. In this embodiment, description is given below of an example where semiconductor substrate 10 is formed using an n-type crystalline silicon substrate.

On light-receiving surface 10a of semiconductor substrate 10, i-type amorphous semiconductor layer 17i is formed, which is made of an intrinsic amorphous semiconductor (the intrinsic semiconductor is hereinafter referred to as the "i-type semiconductor"). To be more specific, in this embodiment, i-type amorphous semiconductor layer 17i is formed of i-type amorphous silicon containing hydrogen. The thickness of i-type amorphous semiconductor layer 17i is not particularly limited as long as it does not substantially contribute to power generation. The thickness of i-type amorphous semiconductor layer 17i can be set to, for example, about several Å to 250 Å.

Note that, in the invention, the "amorphous semiconductor" includes a microcrystalline semiconductor. The microcrystalline semiconductor is a semiconductor in which an average particle size of semiconductor crystal deposited in the amorphous semiconductor is in the range of about 1 to 80 nm.

On i-type amorphous semiconductor layer 17i, n-type amorphous semiconductor layer 17n is formed, which has the same conductivity as that of semiconductor substrate 10. N-type amorphous semiconductor layer 17n is an amorphous semiconductor layer which is doped with an n-type dopant and has the n-type conductivity. To be more specific, in this embodiment, n-type amorphous semiconductor layer 17n is made of n-type amorphous silicon containing hydrogen. The thickness of n-type amorphous semiconductor layer 17n is not particularly limited. The thickness of n-type amorphous semiconductor layer 17n can be set to, for example, about 20 Å to 500 Å.

On n-type amorphous semiconductor layer 17n, insulating layer 16 is formed, which serves both as an antireflection film and as a protective film. Insulating layer 16 can be formed of, for example, silicon oxide, silicon nitride or silicon oxynitride. The thickness of insulating layer 16 can be set according to antireflection properties and the like of the antireflection film to be provided. The thickness of insulating layer 16 can be set to, for example, about 80 nm to 1 μm.

The laminate structure of i-type amorphous semiconductor layer 17i, n-type amorphous semiconductor layer 17n and insulating layer 16 described above functions as a passivation layer and as an antireflection film for semiconductor substrate 10.

On back surface 10b of semiconductor substrate 10, IN laminate 12 and IP laminate 13 are formed. As shown in FIG. 1, each of IN laminate 12 and IP laminate 13 is formed in a comb-teeth shape. IN laminate 12 and IP laminate 13 are configured to mesh with each other. Thus, on back surface 10b, IN laminate 12 and IP laminate 13 are alternately arranged along direction x perpendicular to intersection width direction y. IN laminate 12 and IP laminate 13 which are adjacent to each other in direction x are in contact with each other. More specifically, in this embodiment, substantially the entire back surface 10b is covered with IN laminate 12 and IP laminate 13. Note that width W1 (see FIG. 2) of IN laminate 12 and interval W2 of IN laminate 12 in direction x can be set to, for example, about 100 μm to 1.5 mm, respectively. Width W1 and interval W2 may be equal to or different from each other.

IN laminate 12 is a laminate including i-type amorphous semiconductor layer 12i formed on back surface 10b and n-type amorphous semiconductor layer 12n formed on i-type amorphous semiconductor layer 12i. As in the case of i-type amorphous semiconductor layer 17i described above, i-type amorphous semiconductor layer 12i is made of amorphous silicon containing hydrogen. The thickness of i-type amorphous semiconductor layer 12i is not particularly limited as long as it does not substantially contribute to power generation. The thickness of i-type amorphous semiconductor layer 12i can be set to, for example, about several Å to 250 Å.

As in the case of n-type amorphous semiconductor layer 17n, n-type amorphous semiconductor layer 12n is doped with an n-type dopant and has the same n-type conductivity as that of semiconductor substrate 10. To be more specific, in this embodiment, n-type amorphous semiconductor layer 12n is made of n-type amorphous silicon containing hydrogen. The thickness of n-type amorphous semiconductor layer 12n is not particularly limited. The thickness of n-type amorphous semiconductor layer 12n can be set to, for example, about 20 Å to 500 Å.

Insulating layer 18 is formed on both end portions of IN laminate 12 in direction x except for a center portion thereof. The center portion of IN laminate 12 in direction x is exposed from insulating layer 18. Width W3 of insulating layer 18 in direction x is not particularly limited but can be set to, for example, about ⅓ of width W1. Moreover, interval W4 between insulating layers 18 in direction x is also not particularly limited but can be set to, for example, about ⅓ of width W1.

The material of insulating layer 18 is not particularly limited. Insulating layer 18 can be formed of, for example, silicon oxide, silicon nitride, silicon oxynitride or the like. Among those, it is preferable that insulating layer 18 is formed of silicon nitride. It is also preferable that insulating layer 18 contains hydrogen.

IP laminate 13 is formed on a portion of back surface 10b exposed from IN laminate 12 and on end portions of insulating layer 18. Thus, both end portions of IP laminate 13 overlap with IN laminate 12 in height direction z.

IP laminate 13 is a laminate including i-type amorphous semiconductor layer 13i formed on back surface 10b and p-type amorphous semiconductor layer 13p formed on i-type amorphous semiconductor layer 13i.

i-type amorphous semiconductor layer 13i is made of amorphous silicon containing hydrogen. The thickness of i-type amorphous semiconductor layer 13i is not particularly limited as long as it does not substantially contribute to power generation. The thickness of i-type amorphous semiconductor layer 13i can be set to, for example, about several Å to 250 Å.

p-type amorphous semiconductor layer 13p is an amorphous semiconductor layer which is doped with a p-type dopant and has a p-type conductivity. To be more specific, in this embodiment, p-type amorphous semiconductor layer 13p is made of p-type amorphous silicon containing hydrogen. The thickness of p-type amorphous semiconductor layer 13p is not particularly limited. The thickness of p-type amorphous semiconductor layer 13p can be set to, for example, about 20 Å to 500 Å.

As described above, in this embodiment, a structure is formed in which i-type amorphous semiconductor layer 13i having the thickness that does not substantially contribute to power generation is provided between crystalline semiconductor substrate 10 and p-type amorphous semiconductor layer 13p. By adopting such a structure in this embodiment, minority carriers can be prevented from being recombined at the junction interface between semiconductor substrate 10 and IP laminate 13. As a result, photoelectric conversion efficiency can be improved.

Note that it is preferable that amorphous semiconductor layers 17, 12 and 13 contain hydrogen to improve passivation properties.

On n-type amorphous semiconductor layer 12n, n-side electrode 14 is formed as a first electrode to collect electrons. On the other hand, on p-type amorphous semiconductor layer 13p, p-side electrode 15 is formed as a second electrode to collect holes. P-side electrode 15 and n-side electrode 14 are electrically insulated from each other. Note that interval W5 between n-side electrode 14 and p-side electrode 15 on insulating layer 18 can be set to, for example, about ⅓ of width W3.

As described above, in this embodiment, each of IN laminate 12 and IP laminate 13 is formed in the comb-teeth shape. Thus, as shown in FIG. 1, n-side electrode 14 and p-side electrode 15 have bus bars 14A and 15A and multiple fingers 14B and 15B, respectively. However, each of n-side electrode 14 and p-side electrode 15 may be a so-called bus bar-less electrode including only multiple fingers and having no bus bar.

In this embodiment, bus bar 14A of n-side electrode 14 and bus bar 15A of p-side electrode 15 have substantially the same area. Fingers 14B of n-side electrode 14 are narrower than fingers 15B of p-side electrode 15. More specifically, width W6 of fingers 14B is smaller than width W7 of fingers 15B. Moreover, the number of fingers 14B is 1 fewer than the number of fingers 15B. Therefore, n-side electrode 14 is smaller in area than p-side electrode 15.

Note that it is preferable that W6/W7 is within the range of, for example, 0.5 to 1.

N-side electrode 14 and p-side electrode 15 are not particularly limited as long as they can collect carriers. In this embodiment, each of n-side electrode 14 and p-side electrode 15 includes a laminate of first to fourth conductive layers 19a to 19d.

First conductive layer 19a can be formed of TCO (Transparent Conductive Oxide) or the like, such as ITO (indium tin oxide), for example. To be more specific, in this embodiment, first conductive layer 19a is formed of ITO. The thickness of first conductive layer 19a can be set to, for example, about 50 to 100 nm. Note that first conductive layer 19a can be formed by use of a thin-film formation method such as a sputtering method and a CVD (Chemical Vapor Deposition) method, for example.

Second to fourth conductive layers 19b to 19d can be formed of metal or alloy such as Cu, for example. To be more specific, in this embodiment, second and third conductive layers 19b and 19c are formed of Cu, respectively. Fourth conductive layer 19d is formed of Sn. The thicknesses of second to fourth conductive layers 19b to 19d are, for example, about 50 nm to 1 μm, about 10 μm to 20 μm, and about 1 μm to 5 μm, respectively.

In this embodiment, second conductive layer 19b among first to fourth conductive layers 19a to 19d forms a seed layer. Here, the "seed layer" means a layer to be a source of plating growth. The seed layer is generally made of metal or alloy. Second conductive layer 19b as the seed layer can be formed by use of a thin-film formation method or the like, such as the sputtering method, a deposition method, a printing method or an ink jet method, besides a plating method.

In this embodiment, third and fourth conductive layers 19c and 19d are formed of plated films.

Next, a method of manufacturing solar cell 1 of this embodiment is described mainly with reference to FIGS. 3 to 13.

First, semiconductor substrate 10 (see FIGS. 4 and 2) is prepared. Next, in Step S1, light-receiving surface 10a and back surface 10b of semiconductor substrate 10 are cleaned. Semiconductor substrate 10 can be cleaned using, for example, an HF solution or the like. Note that, in this Step S1, a texture structure is formed on light-receiving surface 10a of semiconductor substrate 10. However, no texture structure is formed on back surface 10b.

Figure 5:
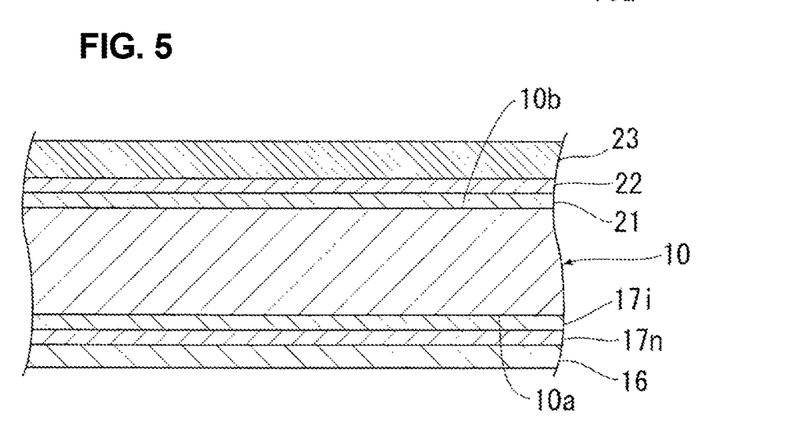
FIG. 5 is a schematic cross-sectional view for explaining the steps of production of the solar cell.

Next, in Step S2, i-type amorphous semiconductor layer 17i and n-type amorphous semiconductor layer 17n are formed on light-receiving surface 10a of semiconductor substrate 10. At the same time, i-type amorphous semiconductor layer 21 and n-type amorphous semiconductor layer 22 are formed on back surface 10b. A method for forming i-type amorphous semiconductor layers 17i and 21 as well as n-type amorphous semiconductor layers 17n and 22 is not particularly limited. I-type amorphous semiconductor layers 17i and 21 as well as n-type amorphous semiconductor layers 17n and 22 can be formed using, for example, a CVD (Chemical Vapor Deposition) method, such as a plasma CVD method, or the like.

Figure 6:
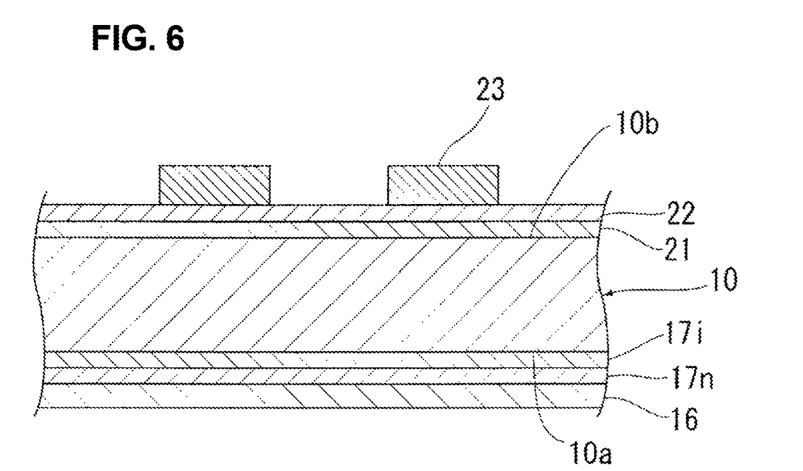
FIG. 6 is a schematic cross-sectional view for explaining the steps of production of the solar cell.

Then, in Step S3, insulating layer 16 is formed on n-type amorphous semiconductor layer 17n, and insulating layer 23 is formed on n-type amorphous semiconductor layer 22. Note that a method for forming insulating layers 16 and 23 is not particularly limited. Insulating layers 16 and 23 can be formed using a thin-film formation method or the like, such as a sputtering method and the CVD method, for example.

Figure 7:
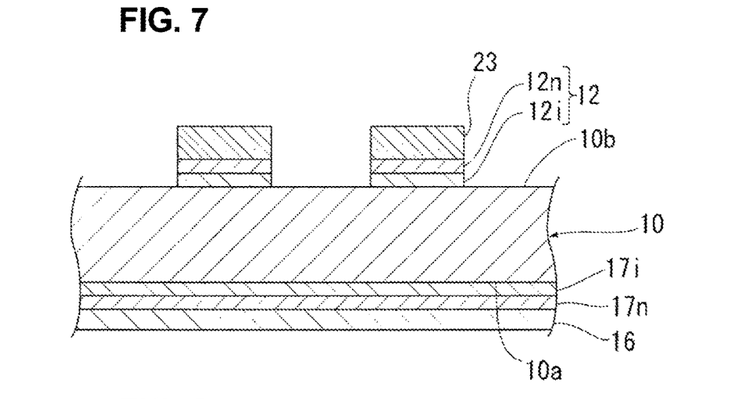
FIG. 7 is a schematic cross-sectional view for explaining the steps of production of the solar cell.

Next, in Step S4, insulating layer 23 is etched to be partially removed. To be more specific, a portion of insulating layer 23, which is located on a region where a p-type semiconductor layer is to be joined to semiconductor substrate 10 in a subsequent step. Note that the etching of insulating layer 23 can be performed using an acid etchant such as the HF solution, for example, when insulating layer 23 is made of silicon oxide, silicon nitride or silicon oxynitride.

Figure 8:
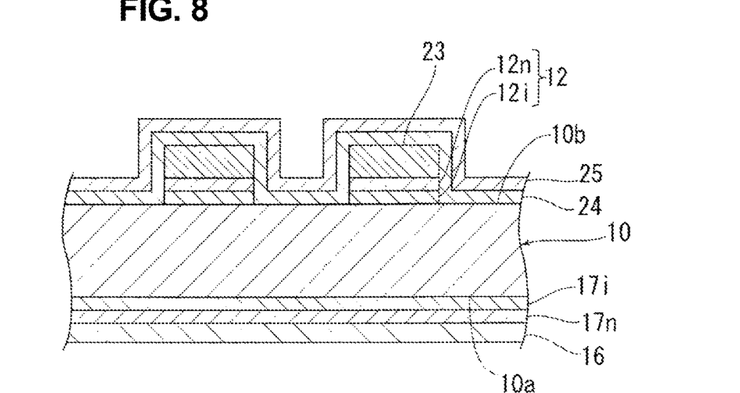
FIG. 8 is a schematic cross-sectional view for explaining the steps of production of the solar cell.

Next, in Step S5, using insulating layer 23 patterned in Step S4 as a mask, i-type amorphous semiconductor layer 21 and n-type amorphous semiconductor layer 22 are etched with an alkaline etchant. Thus, portions of i-type amorphous semiconductor layer 21 and n-type amorphous semiconductor layer 22, other than those covered with insulating layer 23 are removed. Accordingly, a portion of back surface 10b, above which no insulating layer 23 is located, is exposed. At the same time, i-type amorphous semiconductor layer 12i and n-type amorphous semiconductor layer 12n (see FIG. 2) are formed using semiconductor layers 21 and 22.

Here, as described above, in this embodiment, insulating layer 23 is made of silicon oxide, silicon nitride or silicon oxynitride. Thus, while an etching rate of insulating layer 23 using an acid etchant is high, an etching rate of insulating layer 23 using an alkaline etchant is low. On the other hand, semiconductor layers 21 and 22 are made of amorphous silicon. Thus, as to semiconductor layers 21 and 22, an etching rate using the acid etchant is low, and an etching rate using the alkaline etchant is high. Accordingly, with the acid etchant used in Step S4, insulating layer 23 is etched but semiconductor layers 21 and 22 are not substantially etched. On the other hand, with the alkaline etchant used in Step S5, semiconductor layers 21 and 22 are etched but insulating layer 23 is not substantially etched. Therefore, in Steps S4 and S5, insulating layer 23 or semiconductor layers 21 and 22 can be selectively etched.

As described above, in Steps S1 to S5, semiconductor substrate 10 is prepared, which has back surface 10b as a first main surface and light-receiving surface 10a as a second main surface. Moreover, in semiconductor substrate 10, n-type amorphous semiconductor layer 12n made of an n-type semiconductor is formed on a part of back surface 10b, and insulating layer 23 is formed so as to cover n-type amorphous semiconductor layer 12n.

Figure 9:
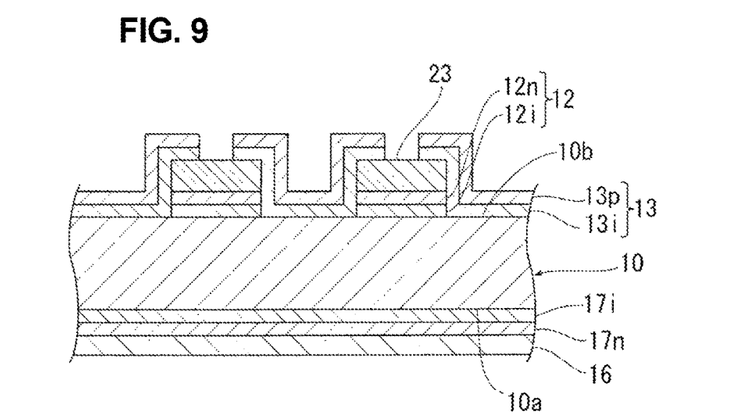
FIG. 9 is a schematic cross-sectional view for explaining the steps of production of the solar cell.

Next, in Step S6, i-type amorphous semiconductor layer 24 and p-type amorphous semiconductor layer 25 are sequentially formed in this order so as to cover back surface 10b. A method for forming amorphous semiconductor layers 24 and 25 is not particularly limited. Amorphous semiconductor layers 24 and 25 can be formed using, for example, the CVD method or the like.

Figure 10:
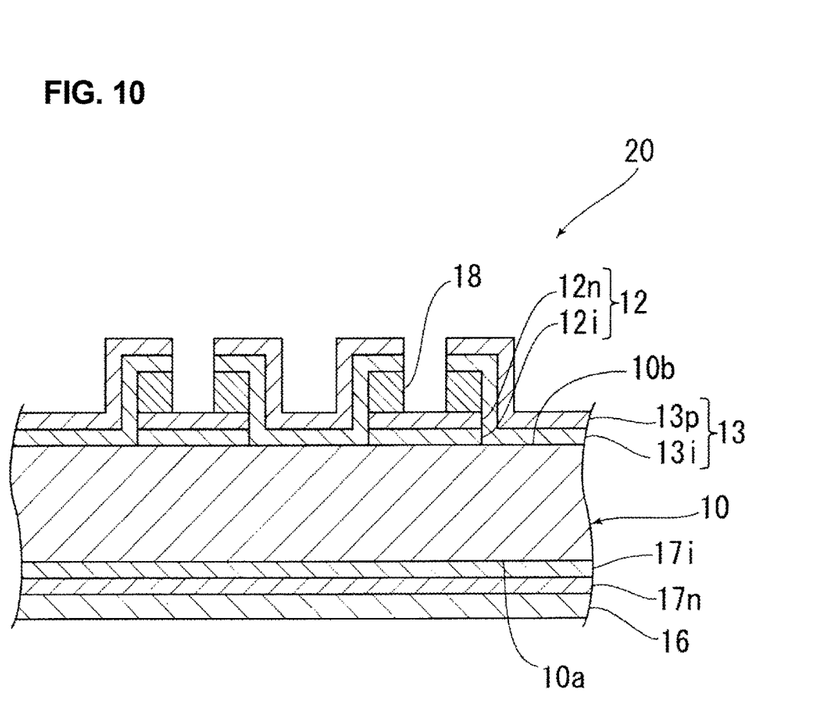
FIG. 10 is a schematic cross-sectional view for explaining the steps of production of the solar cell.

Thereafter, in Step S7, portions of amorphous semiconductor layers 24 and 25, which are located on insulating layer 23, are partially etched. Thus, i-type amorphous semiconductor layer 13i and p-type amorphous semiconductor layer 13p are formed from amorphous semiconductor layers 24 and 25.

This Step S7 uses a first etching agent which etches amorphous semiconductor layers 24 and 25 at a higher etching rate than that for insulating layer 23. For this reason, among insulating layer 23 and amorphous semiconductor layers 24 and 25, amorphous semiconductor layers 24 and 25 are selectively etched.

Note that the "etching agent" includes an etching paste and a viscosity-adjusted etching ink.

Figure 11:
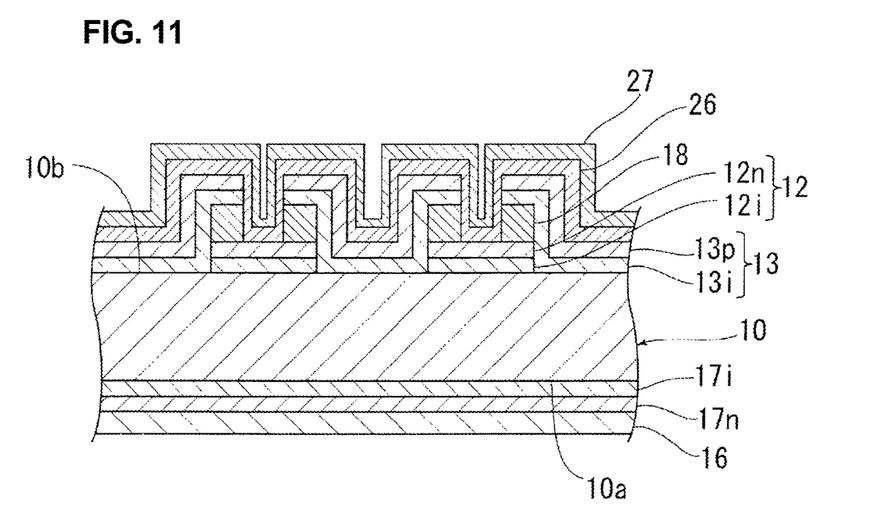
FIG. 11 is a schematic cross-sectional view for explaining the steps of production of the solar cell.

Next, insulating layer 23 is etched in Step S8. To be more specific, an exposed portion of insulating layer 23 is removed by etching, using a second etching agent, from above amorphous semiconductor layers 13i and 13p made of amorphous semiconductor layers 24 and 25 partially removed by the etching in Step S7. Thus, n-type amorphous semiconductor layer 12n is exposed, and insulating layer 18 is formed from insulating layer 23.

This Step S8 uses the second etching agent which etches insulating layer 23 at a higher etching rate than that for amorphous semiconductor layers 24 and 25. For this reason, among insulating layer 23 and amorphous semiconductor layers 24 and 25, insulating layer 23 is selectively etched.

As described above, in Steps S1 to S8, solar cell substrate 20 is formed, which has a p-type surface (a surface of p-type amorphous semiconductor layer 13p) in one region of one main surface, and an n-type surface (a surface of n-type amorphous semiconductor layer 12n) in another region.

Subsequently, in Step S9, solar cell 1 can be completed by performing an electrode formation process to form n-side electrode 14 and p-side electrode 15 on n-type amorphous semiconductor layer 12n and p-type amorphous semiconductor layer 13p, respectively.

Figure 12:
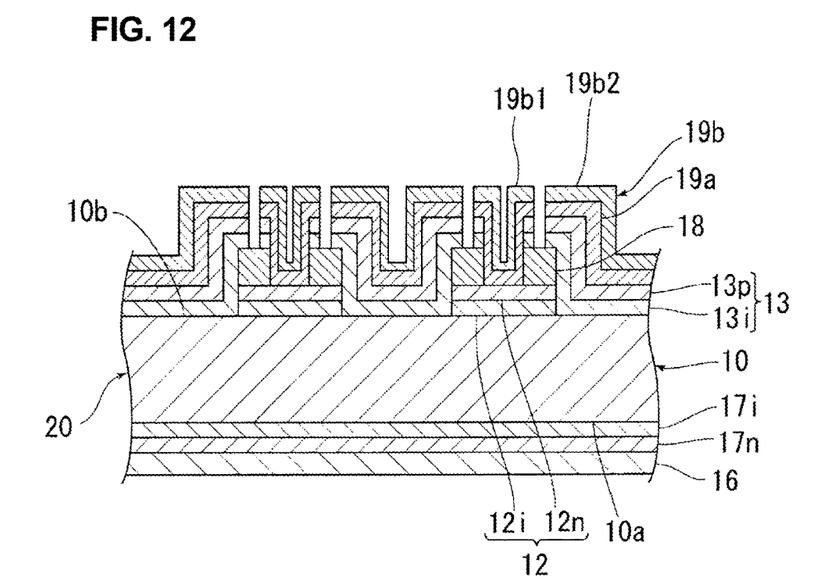
FIG. 12 is a schematic cross-sectional view for explaining the steps of production of the solar cell.

To be more specific, first, in Step S9-1, conductive layer 26 made of TCO and conductive layer 27 made of metal or alloy such as Cu are formed in this order using a CVD (Chemical Vapor Deposition) method such as a plasma CVD method or a thin-film formation method such as a sputtering method. Thereafter, as shown in FIG. 12, portions of conductive layers 26 and 27, which are positioned above insulating layer 18, are divided. Thus, first and second conductive layers 19a and 19b are formed from conductive layers 26 and 27. Here, in this embodiment, since second conductive layer 19b forms a seed layer as described above, seed layers are formed for n-side electrode 14 and p-side electrode 15, respectively.

As shown in FIG. 12, second conductive layer 19b as the seed layer includes first seed layer 19b1 positioned above n-type amorphous semiconductor layer 12n and second seed layer 19b2 positioned above p-type amorphous semiconductor layer 13p. In this embodiment, first seed layer 19b1 and second seed layer 19b2 have different areas. To be more specific, the area of first seed layer 19b1 is smaller than that of second seed layer 19b2. Moreover, a width of a portion forming fingers 14B of first seed layer 19b1 is smaller than that of a portion forming fingers 15B of second seed layer 19b2.

Note that the division of conductive layers 26 and 27 can be performed using, for example, a photolithography method or the like.

Next, third conductive layer 19c made of Cu and fourth conductive layer 19d made of Sn are sequentially formed by electrolytic plating on first and second conductive layers 19a and 19b. Thus, n-side electrode 14 and p-side electrode 15 shown in FIG. 2 can be completed.

Here, in this embodiment, as described above, the area of first seed layer 19b1 is smaller than that of second seed layer 19b2. Moreover, when currents having the same magnitude are allowed to flow through first seed layer 19b1 and second seed layer 19b2, plated films having the same mass are formed on first and second seed layers 19b1 and 19b2, respectively. Thus, when the currents having the same magnitude are allowed to flow through first seed layer 19b1 and second seed layer 19b2, first plated film 19cd1 positioned on first seed layer 19b1 is larger in thickness than second plated film 19cd2 positioned on second seed layer 19b2, in conductive layers 19c and 19d. Thus, the electrical resistance of n-side electrode 14, which has a relatively small area and tends to have high electrical resistance, can be reduced effectively. As a result, power generation efficiency of solar cell 1 can be further improved.

Here, the same power source is used to supply currents to first seed layer 19b1 and second seed layer 19b2. Thus, the currents having the same magnitude are easily allowed to flow through both seed layers 19b1 and 19b2. Therefore, production of solar cell 1 is facilitated.

For example, from the viewpoint of reduction of the electrical resistance of the electrodes, it is also conceivable to form both of the n-side electrode and the p-side electrode in large thickness. However, in such a case, the n-side electrode and the p-side electrode, which are adjacent to each other, are likely to come into contact with each other. For this reason, the interval between the n-side electrode and the p-side electrode needs to be increased. This may lead to a situation where the areas of the n-side and p-side electrodes are reduced and the electrical resistance of the electrodes cannot be reduced.

On the other hand, in this embodiment, n-side electrode 14, which has a relatively small area and tends to have high electrical resistance, is formed to be taller than p-side electrode 15. Thus, n-side electrode 14 and p-side electrode are unlikely to come into contact with each other. Accordingly, interval W5 between n-side electrode 14 and p-side electrode 15 can be reduced. As a result, the electrical resistance of n-side electrode 14 can be reduced more effectively.

Moreover, when both of the n-side electrode and the p-side electrode are formed in large thickness, a large stress is likely to act on the semiconductor substrate. As a result, warping of the semiconductor substrate is likely to occur. In this embodiment, on the other hand, p-side electrode 15 is thinner than n-side electrode 14. Thus, a large stress is unlikely to act on semiconductor substrate 10. Therefore, the warping of semiconductor substrate 10 can be suppressed.

Note that a ratio of the thickness of n-side electrode 14 to the thickness of p-side electrode 15 ((thickness of n-side electrode 14)/(thickness of p-side electrode 15)) is not particularly limited but is preferably within the range of 1 to 2.

Moreover, the thicknesses of first and second plated films 19$cd$1 and 19$cd$2 can be adjusted by adjusting the currents to flow through first and second seed layers 19$b$1 and 19$b$2 during the formation of first and second plated films 19$cd$1 and 19$cd$2 in Step S9-1. For example, allowing currents having different magnitudes to flow through first and second seed layers 19$b$1 and 19$b$2 enables formation of first and second plated films 19$cd$1 and 19$cd$2 having a thickness ratio different from that when the currents having the same magnitude are allowed to flow through first and second seed layers 19$b$1 and 19$b$2. To be more specific, first and second plated films 19$cd$1 and 19$cd$2 having the same thickness can also be formed. Therefore, the electrical resistance of n-side electrode 14 and p-side electrode 15 can be adjusted according to the requisite characteristics of solar cell 1.

Figure 2:
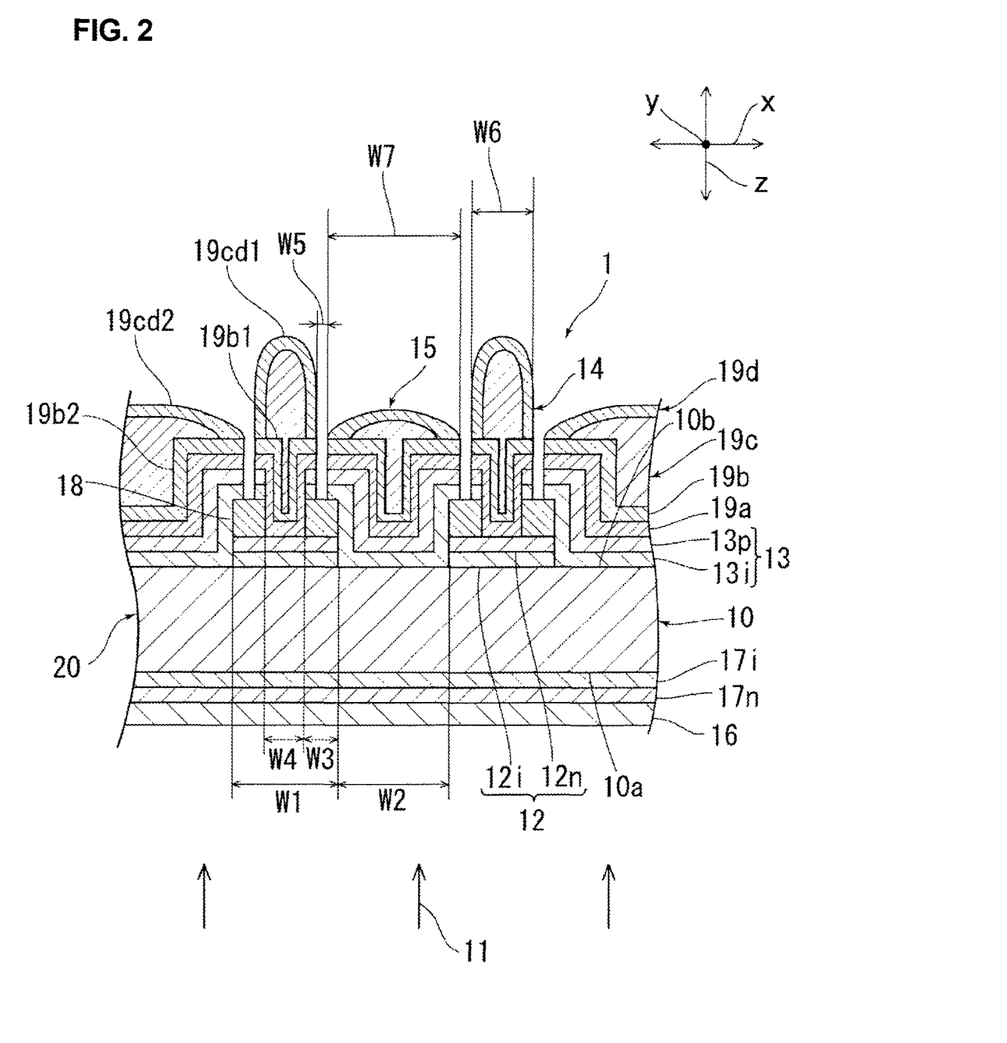
FIG. 2 is a schematic partial cross-sectional view taken along the line II-II in FIG. 1.
Figure 3:
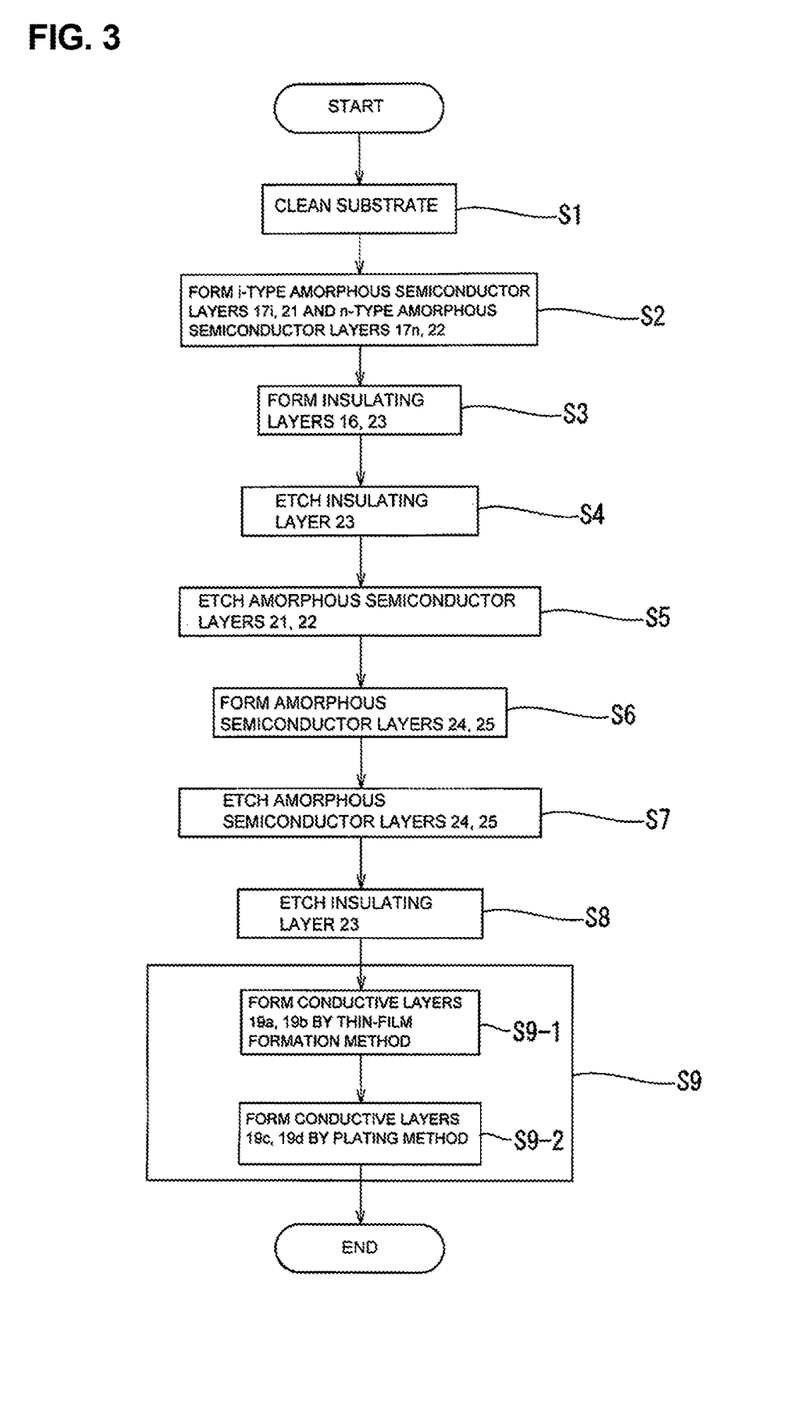
FIG. 3 is a flowchart showing steps of production of the solar cell according to the first embodiment.
Figure 4:
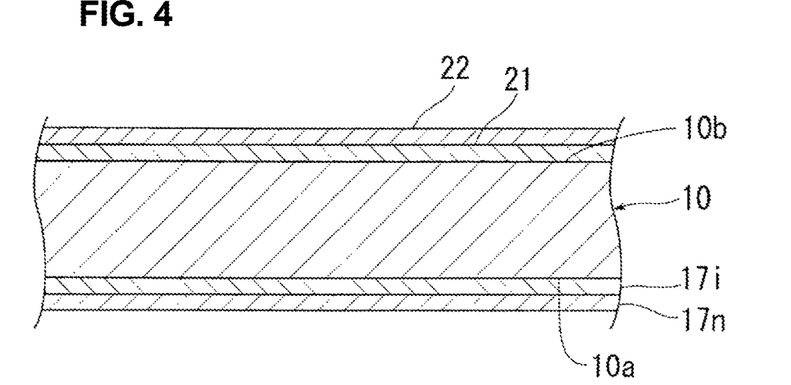
FIG. 4 is a schematic cross-sectional view for explaining the steps of production of the solar cell.

Furthermore, in the first embodiment, the description has been given of the example where the crystalline semiconductor substrate having the n-type conductivity is used as semiconductor substrate 10, and n-type amorphous semiconductor layer 12$n$ and p-type amorphous semiconductor layer 13$p$ are formed on semiconductor substrate 10 as shown in FIG. 2. However, the invention is not limited to this configuration.

Figure 13:
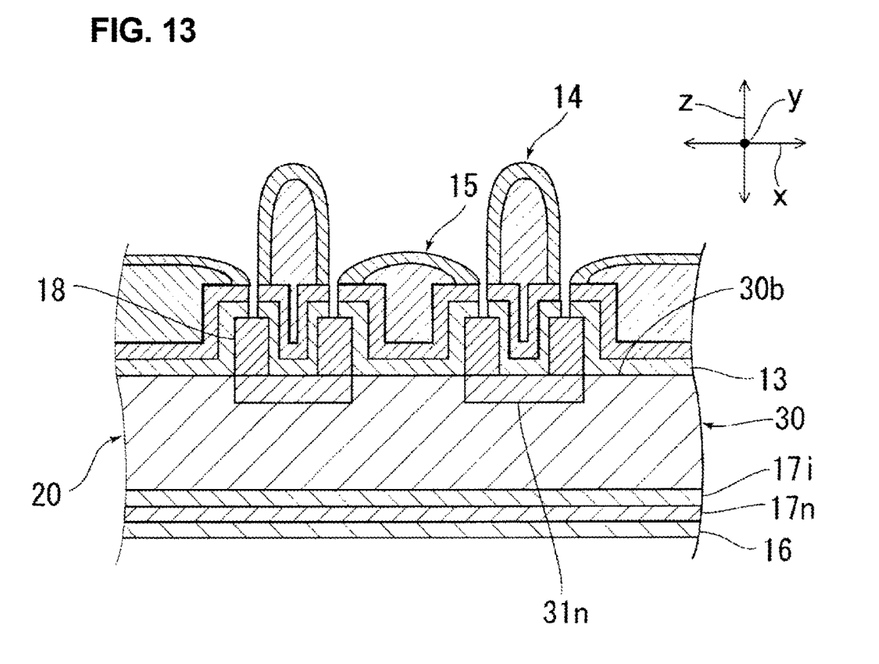
FIG. 13 is a schematic cross-sectional view of a solar cell according to a second embodiment.

For example, as shown in FIG. 13, heavily-doped n+ type region 31$n$ may be formed in a portion of back surface 30$b$ of n-type crystalline semiconductor substrate 30 by thermally diffusing an n-type dopant in a part of the portion of back surface 30$b$ of crystalline semiconductor substrate 30.

Moreover, a heavily-doped n-type region may be formed by thermally diffusing an n-type dopant in one region of the back surface of n-type crystalline semiconductor substrate 30, and a p-type region may be formed by thermally diffusing a p-type dopant in another region. In this case, a surface of the n-type region which is more heavily doped than the semiconductor substrate forms an n-type surface of the invention, and a surface of the p-type region forms a p-type surface.

Furthermore, when the p-type surface or the n-type surface is formed of the surface of the crystalline semiconductor substrate, first conductive layer 19$a$ made of TCO does not particularly have to be provided. First conductive layer 19$a$ made of TCO may be provided on the surface formed of the amorphous semiconductor layer, either the p-type surface or the n-type surface.

EXPLANATION OF REFERENCE NUMERALS 1 solar cell
10 semiconductor substrate
10$a$ light-receiving surface
10$b$ back surface
11 light
12 IN laminate
12$i$ i-type amorphous semiconductor layer
12$n$ n-type amorphous semiconductor layer
13 IP laminate
13$i$ i-type amorphous semiconductor layer
13$p$ p-type amorphous semiconductor layer
14 n-side electrode
15 p-side electrode
14A, 15A bus bar
14B, 15B finger
16 insulating layer
17$i$ i-type amorphous semiconductor layer
17$n$ n-type amorphous semiconductor layer
18 insulating layer
19$a$ first conductive layer
19$b$ second conductive layer
19$b$1 first seed layer
19$b$2 second seed layer
19$c$ third conductive layer
19$d$ fourth conductive layer
19$cd$1 first plated film
19$cd$2 second plated film
20 solar cell substrate
21 i-type amorphous semiconductor layer
22 n-type amorphous semiconductor layer
23 insulating layer
24 i-type amorphous semiconductor layer
25 p-type amorphous semiconductor layer
26, 27 conductive layer
30 amorphous semiconductor substrate
30$b$ back surface
31$n$ n+ type region

The invention claimed is:

1. A method of manufacturing a solar cell, comprising:
forming an insulating layer, a p-type amorphous silicon and an n-type amorphous silicon on a crystal n-type silicon substrate, the p-type amorphous silicon provided on one region and the n-type amorphous silicon provided on another region of a back surface of the crystal n-type silicon substrate, wherein the insulating layer is provided on the n-type amorphous silicon in a region, and a part of the p-type amorphous silicon is provided on the insulating layer in the region such that:
in the region, the n-type silicon substrate, the n-type amorphous silicon, the insulating layer, and the p-type amorphous silicon are stacked in the given order in a thickness direction orthogonal to the back surface and are overlapped with each other in the region in the thickness direction; and
in a plan view, each of the p-type amorphous silicon and the n-type amorphous silicon comprises finger portions extending in a first direction, wherein the finger portions of the p-type amorphous silicon and the finger portions of the n-type amorphous silicon are alternatingly provided in a second direction orthogonal to the first direction such that the finger portions of the p-type amorphous silicon are interdigitated with the finger portions of the n-type amorphous silicon on the back surface;

forming a seed layer on the p-type amorphous silicon and the n-type amorphous silicon;

removing a portion of the seed layer above the insulating layer to separate the seed layer to form a seed layer on the p-type amorphous silicon and a seed layer on the n-type amorphous silicon, wherein the seed layer formed on the p-type amorphous silicon and the seed layer formed on the n-type amorphous silicon are divided and electrically separated above the insulating layer such that a width of the seed layer on each of the finger portions of the p-type amorphous silicon is different from a width of the seed layer on each of the finger portions of the n-type amorphous silicon in the second direction; and forming a plated film on the seed layer formed on the p-type amorphous silicon and a plated film on the seed layer formed on the n-type amorphous silicon by electrolytic plating using a common power source to supply currents to the seed layers on the p-type amorphous silicon and the n-type amorphous silicon such that the plated film formed on each finger portion of one of the p-type amorphous silicon and the n-type amorphous silicon, which has a larger width in the second direction than the plated film formed on each of the finger portions of the other of the p-type amorphous silicon and the n-type amorphous silicon, has a smaller thickness in the thickness direction orthogonal to a plane of the back surface than the plated film formed on each of the finger portions of the other of the p-type amorphous silicon and the n-type amorphous silicon.

2. The method of manufacturing a solar cell, according to claim 1, wherein
forming the seed layers in the electrically separated state on the p-type amorphous silicon and the n-type amorphous silicon, respectively, includes forming a continuous metal layer on the p-type amorphous silicon and on the n-type amorphous silicon and then electrically separating the metal layer.

3. The method of manufacturing a solar cell, according to claim 1, wherein
a front surface of the substrate is a light-receiving surface.

4. The method of manufacturing a solar cell, according to claim 3, wherein
the substrate has a passivation film on the front surface.

5. The method of manufacturing a solar cell according to claim 1, wherein
forming the seed layers forms the seed layers such that the width of each of the finger portions of the p-type amorphous silicon, is greater, in the second direction, than the width of each of the finger portions of the n-type amorphous silicon.

6. The method of manufacturing a solar cell according to claim 1, wherein
forming the seed layers forms the seed layers such that an area of the seed layer on one of the p-type amorphous silicon and the n-type amorphous silicon that forms a pn junction, is greater than an area of the seed layer on the other of the p-type amorphous silicon and the n-type amorphous silicon.

7. A method of manufacturing a solar cell, comprising:
forming an n-type amorphous silicon on one region in a back surface of a crystal n-type silicon substrate, forming an insulating layer on the n-type amorphous silicon, forming a p-type amorphous silicon on another region in the back surface of the crystal n-type silicon substrate and on the insulating layer such that, in a region where the insulation layer is provided, the n-type silicon substrate, the n-type amorphous silicon, the insulating layer, and the p-type amorphous silicon are stacked in the given order in a thickness direction orthogonal to the back surface and are overlapped with each other in the thickness direction and such that each of the p-type amorphous silicon and the n-type amorphous silicon comprises finger portions extending in a first direction, wherein the finger portions of the p-type amorphous silicon and the finger portions of the n-type amorphous silicon are alternatingly provided in a second direction orthogonal to the first direction such that the finger portions of the p-type amorphous silicon are interdigitated with the finger portions of the n-type amorphous silicon on the back surface;

forming a seed layer on the p-type amorphous silicon and the n-type amorphous silicon;

removing a portion of the seed layer above the insulating layer to separate the seed layer to form a seed layer on the p-type amorphous silicon and a seed layer on the n-type amorphous silicon, wherein the seed layer formed on the p-type amorphous silicon and the seed layer formed on the n-type amorphous silicon are divided and electrically separated above the insulating layer such that a width of the seed layer on each of the finger portions of the p-type amorphous silicon is different from a width of the seed layer on each of the finger portions of the n-type amorphous silicon in the second direction; and forming a plated film on the seed layer formed on the p-type amorphous silicon and a plated film on the seed layer formed on the n-type amorphous silicon by electrolytic plating using a common power source to supply currents to the seed layers on the p-type amorphous silicon and the n-type amorphous silicon such that the plated film formed on each finger portion of one of the p-type amorphous silicon and the n-type amorphous silicon, which has a larger width in the second direction than the plated film formed on each of the finger portions of the other of the p-type amorphous silicon and the n-type amorphous silicon, has a smaller thickness in the thickness direction orthogonal to a plane of the back surface than the plated film formed on each of the finger portions of the other of the p-type amorphous silicon and the n-type amorphous silicon.

* * * * *